United States Patent
Sicard

(10) Patent No.: US 7,795,904 B1
(45) Date of Patent: Sep. 14, 2010

(54) SWITCHING CIRCUIT HAVING A DRIVER FOR PROVIDING A LINEAR VOLTAGE TRANSITION

(76) Inventor: Thierry Sicard, 2516 N. Karen Dr., Chandler, AZ (US) 85224

( * ) Notice: Subject to any disclaimer, the term of this patent is extended or adjusted under 35 U.S.C. 154(b) by 0 days.

(21) Appl. No.: 12/550,682

(22) Filed: Aug. 31, 2009

(51) Int. Cl.
*H03K 19/003* (2006.01)

(52) U.S. Cl. .............................. 326/29; 326/68; 327/170

(58) Field of Classification Search ................... 326/29, 326/68; 327/108, 109, 170
See application file for complete search history.

(56) References Cited

U.S. PATENT DOCUMENTS

| | | | |
|---|---|---|---|
| 4,360,745 A | 11/1982 | Prince | |
| 5,317,206 A * | 5/1994 | Hanibuchi et al. | 326/21 |
| 5,955,872 A | 9/1999 | Grimm | |
| 6,617,897 B2 * | 9/2003 | Lee | 327/170 |
| 6,885,225 B2 * | 4/2005 | Ohmichi et al. | 327/112 |
| 7,388,422 B2 * | 6/2008 | Khan et al. | 327/536 |

* cited by examiner

*Primary Examiner*—James Cho
(74) *Attorney, Agent, or Firm*—Daniel D. Hill

(57) ABSTRACT

A switching circuit includes a first transistor and a driver circuit. The first transistor has a first current electrode coupled to a first power supply voltage terminal to receive a first power supply voltage, a control electrode, and a second current electrode coupled to an output terminal. The driver circuit has an output coupled to the control electrode of the first transistor, the driver circuit for providing a bias current to the control electrode of the first transistor that is proportional to an inverse of a square root of a voltage between the first current electrode and the control electrode of the first transistor. A voltage at the output terminal increases linearly during a turn-on period of the first transistor.

20 Claims, 3 Drawing Sheets

SWITCHING CIRCUIT HAVING A DRIVER FOR PROVIDING A LINEAR VOLTAGE TRANSITION

BACKGROUND

1. Field

This disclosure relates generally to circuits, and more specifically, to a switching circuit having a driver for providing a substantially linear voltage transition.

2. Related Art

Switching circuits, such as high-side switches and low-side switches, are used for supplying power to motors, lights, and other devices. Switching circuits are commonly used in automotive applications. Various transistor types may be used to implement a switching circuit. A metal-oxide semiconductor (MOS) transistor is one such transistor type.

Generally, a depletion capacitance, also called junction capacitance, is associated with a MOS transistor. The depletion capacitance of a MOS transistor is variable with voltage, so that for a given gate current, the output voltage of the transistor will ramp up in a non-linear manner when the transistor is transitioning from an "off" state to a fully "on" state. The transition may start out at a high ramp rate that lessens as the output voltage increases. The lower ramp up rate can cause the transition from the off state to the fully on state to require a relatively long period of time. The relatively long transition period may be undesirable for some applications. Also, the relatively long transition period may result in increased power dissipation. However, if the transistor is biased with a relatively higher gate current to increase the ramp up rate of the output voltage and to shorten turn on time, the higher ramp up rate may induce electromagnetic interference (EMI) that is undesirable in many applications.

Therefore, what is needed is a switching circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
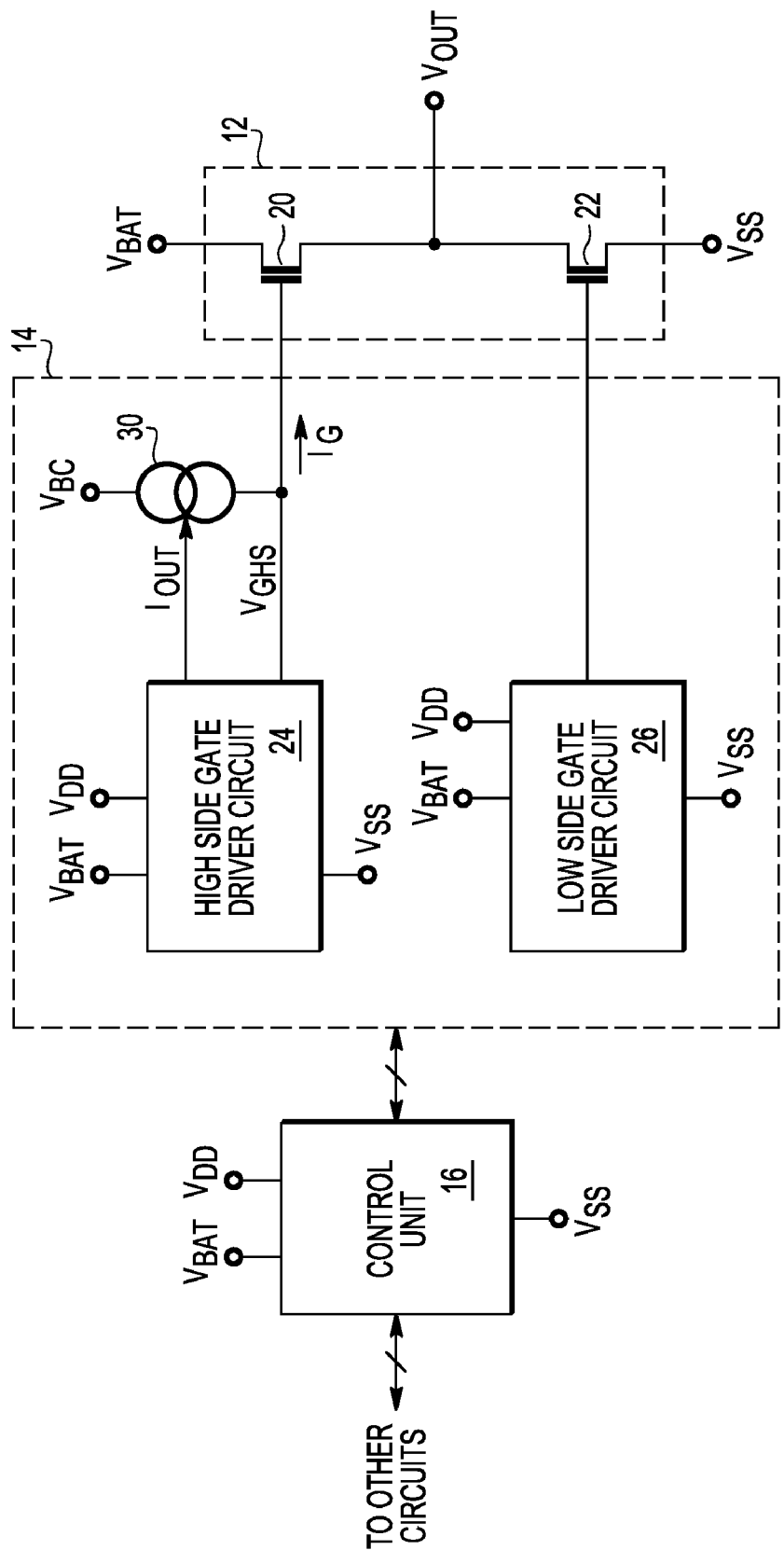
FIG. 1 illustrates, in partial block diagram form and partial schematic diagram form, a switching circuit in accordance with an embodiment.

Generally, there is provided, a switching circuit having a high side gate driver circuit that biases the gate of a high side driver transistor to compensate for the non-linear depletion capacitance. In one embodiment, the gate of the high side transistor is provided with a gate current that is proportional to the inverse of the square root of the high side transistor's drain-gate voltage. This causes a ratio of the gate current to the depletion capacitance to be relatively constant, thus allowing the output voltage of the high side transistor to transition from a logic low to a logic high in a relatively linear manner. This allows the output voltage of the transistor to transition more quickly while also reducing electromagnetic inference (EMI) emissions and power dissipation.

In one aspect, there is provided, a switching circuit comprising: a first transistor having a first current electrode coupled to a first power supply voltage terminal to receive a first power supply voltage, a control electrode, and a second current electrode coupled to an output terminal; and a driver circuit having an output coupled to the control electrode of the first transistor, the driver circuit for providing a bias current to the control electrode of the first transistor that is proportional to an inverse of a square root of a voltage between the first current electrode and the control electrode of the first transistor, wherein a voltage at the output terminal increases linearly during a turn-on period of the first transistor. The driver circuit may further comprise: a subtraction circuit having a first input terminal coupled to the first power supply voltage terminal, a second input terminal coupled to the control electrode of the first transistor, and an output terminal; an inversion circuit having an input terminal coupled to the output terminal of the subtraction circuit, and an output terminal; a square root circuit having an input terminal coupled to the output of the inversion circuit, and an output terminal for providing an output current; and a current source having a first terminal coupled to a second power supply voltage terminal, a control terminal coupled to and a second terminal coupled to provide the bias current to the control electrode of the first transistor. The subtraction circuit may further comprise a clamping circuit for preventing the control electrode of the first transistor from receiving a negative bias voltage. The second power supply terminal may be coupled to receive a boosted voltage. The first transistor may be characterized as being a high side transistor. The switching circuit may further comprise a second transistor having a first current electrode coupled to the second current electrode of the first transistor, a control electrode, and a second current electrode coupled to a second power supply voltage terminal. The first transistor may be characterized as being an N-channel power metal-oxide semiconductor transistor. The driver circuit may comprise bipolar transistors. The switching circuit may further comprise a second driver circuit for biasing a second transistor, the second transistor coupled to the first transistor in a half-bridge configuration. The driver circuit may comprise a trans-linear circuit.

In another aspect, there is provided, a switching circuit comprising: a transistor having a first current electrode coupled to a first power supply voltage terminal to receive a first power supply voltage, a control electrode, and a second current electrode coupled to an output terminal; and a driver circuit comprising: a subtraction circuit having a first input terminal coupled to the first power supply voltage terminal, a second input terminal coupled to the control electrode of the transistor, and an output terminal; an inversion circuit having an input terminal coupled to the output terminal of the subtraction circuit, and an output terminal; a square root circuit having an input terminal coupled to the output of the inversion circuit, and an output terminal for providing an output current; and a current source having a first terminal coupled to a second power supply voltage terminal, a control terminal coupled to and a second terminal coupled to provide the bias current to the control electrode of the transistor. The subtraction circuit may further comprise a clamping circuit for preventing the control electrode of the transistor from receiving a negative bias voltage. The second power supply terminal may be coupled to receive a boosted voltage. The transistor may be characterized as being a high side transistor.

In yet another aspect, there is provided, a switching circuit comprising: a first transistor having a first current electrode coupled to a first power supply voltage terminal to receive a first power supply voltage, a control electrode, and a second current electrode coupled to an output terminal of the switching circuit; a second transistor having a first current electrode coupled to the second current electrode of the first transistor, a control electrode, and a second current electrode coupled to a second power supply voltage terminal; a first driver circuit having an output coupled to the control electrode of the first transistor, the driver circuit for providing a bias current to the control electrode of the first transistor that is proportional to an inverse of a square root of a voltage between the first current electrode and the second current electrode of the first transistor, wherein a voltage at the output terminal increases linearly during a turn-on period of the first transistor; and a second driver circuit having an output coupled to the control electrode of the second transistor, the second driver circuit for controlling operation of the second transistor. The driver circuit may comprise: a subtraction circuit having a first input terminal coupled to the first power supply voltage terminal, a second input terminal coupled to the control electrode of the first transistor, and an output terminal; an inversion circuit having an input terminal coupled to the output terminal of the subtraction circuit, and an output terminal; a square root circuit having an input terminal coupled to the output of the inversion circuit, and an output terminal for providing an output current; and a current source having a first terminal coupled to a second power supply voltage terminal, a control terminal coupled to and a second terminal coupled to provide the bias current to the control electrode of the first transistor. The subtraction circuit may further comprise a clamping circuit for preventing the control electrode of the first transistor from receiving a negative bias voltage. The second power supply terminal may be coupled to receive a boosted voltage. The first and second transistors may be characterized as being N-channel power metal-oxide semiconductor transistors. The switching circuit may further comprise a control unit coupled to control the operation of both the first and second driver circuits.

FIG. 1 illustrates, in partial block diagram form and partial schematic diagram form, a switching circuit 10 in accordance with an embodiment. Switching circuit 10 includes driver transistors 12, driver circuit 14, current source 30, and control unit 16. In the illustrated embodiment, driver transistors 12 includes power MOS (metal-oxide semiconductor) N-channel transistors 20 and 22 connected together in a half-bridge configuration. A portion of driver circuit 14 includes high side gate driver circuit 24, low side gate driver circuit 26, and current source 30. In FIG. 1, current source 30 is illustrated separately from high side gate driver circuit 24 but is functionally considered to be a part of high side gate driver circuit 24. Control unit 16 is bi-directionally coupled to driver circuit 14 for controlling operation of the driver transistors 12. Control unit 16 may comprise a data processor such as a central processing unit (CPU). For purposes of clarity and simplicity, control signals and other functions of driver circuit 14 are not shown. Control unit 16 is also bi-directional coupled to other circuits, such as for example, a body control module in an automobile.

More specifically, N-channel transistor 20 has a current electrode (drain) coupled to a power supply voltage terminal for receiving a power supply voltage labeled "$V_{BAT}$". A current provided to the gate of transistor 20 is labeled "$I_G$". In an automotive application, power supply voltage $V_{BAT}$ may be supplied by a typical 12 volt car battery. In other applications, power supply voltage $V_{BAT}$ may be supplied by another power source. N-channel transistor 20 has a control electrode (gate) coupled to driver circuit 14, and a current electrode (source) coupled to an output terminal labeled "$V_{OUT}$". N-channel transistor 22 has a drain coupled to output terminal $V_{OUT}$, a gate coupled to driver circuit 14 and a source coupled to a power supply voltage terminal for receiving a power supply voltage labeled $V_{BAT}$. N-channel transistor 20 functions as a high side transistor and N-channel transistor 22 functions as a low side transistor. Note that depending on the application, other embodiments of driver transistors 12 may have only a high side transistor, only a low side transistor, two additional transistors coupled together with transistors 20 and 22 to form an H-bridge, or some other driver configuration.

High side gate driver circuit 24 has a first input coupled to receive power supply voltage $V_{BAT}$, a second input coupled to receive a power supply voltage labeled "$V_{DD}$", a third input coupled to power supply voltage terminal $V_{SS}$, a fourth input coupled to the gate of transistor 20 for receiving high side gate voltage $V_{GHS}$, and an output for providing a current labeled "$I_{OUT}$". Current source 30 has a first terminal coupled to receive a voltage labeled "$V_{BC}$", a second terminal coupled to the gate of transistor 20, and a control terminal coupled to receive current $I_{OUT}$. In the illustrated embodiment, power supply voltage $V_{DD}$ is a regulated power supply voltage that is generated from, but provided separately from, voltage $V_{BAT}$. In the illustrated embodiment, voltage $V_{BC}$ is an elevated voltage such as is provided by a bootstrap capacitor (not shown). Power supply voltage terminal $V_{SS}$ is coupled to ground. An embodiment of high side gate driver circuit 24 is illustrated in detail in FIG. 2.

The driver transistors 20 and 22 are very large power MOS transistors implemented on silicon die. In one embodiment, driver transistors 20 and 22 are vertical NMOS transistors having a vertically stacked source, channel region, and drain so that current flow is through a thickness of a semiconductor die rather than laterally as in a planar transistor. In the vertical NMOS transistor, the depletion capacitance is between the gate and a drain region in silicon below a gate oxide layer. The gate may be formed from polysilicon. Driver transistors 20 and 22 may have an output current between about 30 and 250 amperes.

Low side gate driver circuit 26 has a first input coupled for receiving power supply voltage $V_{BAT}$, a second input coupled for receiving power supply voltage $V_{DD}$, a third input coupled to power supply voltage terminal $V_{SS}$, and an output coupled to the gate of transistor 22. Low side gate driver circuit 26 may be implemented using a conventional low side gate driver circuit.

High side gate driver circuit 24 functions to supply driver current to the gate of high side transistor 20. Low side gate driver circuit 26 functions to drive the gate of low side transistor 22. The operations of high side gate driver circuit 24 and low side gate driver circuit 26 are controlled and synchronized by control unit 16 by a predetermined timing. A device to be driven (not shown), for example a motor, is connected to output terminal $V_{OUT}$. Generally, transistors 20 and 22 are alternately turned on and off with no overlap in the "on" times. The high side transistor 20 controls the connection to supply voltage $V_{BAT}$ and low side transistor 22 controls the connection to ground ($V_{SS}$).

A depletion capacitance is an inherent capacitance in transistors where a charge is stored at the PN junctions of the transistors. Because of their size, the depletion capacitance of transistors 20 and 22 may be relatively large. Also, the amount of depletion capacitance is a function of voltage, so that as a voltage is applied to a transistor, the depletion capacitance increases as the voltage increases. Therefore, if a current source is applied to the gate, the depletion capacitance of the transistor will cause a ramp up rate to decrease as the transistor transitions from an "off" state to an "on" state. This nonlinear transition from off to on can increase the time is takes to turn on the transistor, thus increasing power dissipation. Applying a higher voltage to speed up the transition may result in undesirable EMI.

The change in voltage across a PN junction can be expressed as:

$$\Delta V = \frac{\rho \cdot w^2}{\varepsilon} \text{ and } \rho = \frac{\varepsilon \cdot \Delta V}{w^2}$$

where $\rho$ is the charge density, $\varepsilon$ is the relative permittivity and w is the width of the depletion layers. Also, $$Q = \rho \cdot w \cdot A = \frac{\varepsilon \cdot \Delta V w \cdot A}{w^2} = C \cdot \Delta V$$

where A is the capacitor area, Q is charge, and C is capacitance. Therefore, $$C = \frac{\varepsilon \cdot A}{w}$$

$$w = \sqrt{\frac{\varepsilon}{\rho}} \sqrt{\Delta V}$$

$$C = \frac{\varepsilon \cdot A \sqrt{\rho}}{\sqrt{\varepsilon} \sqrt{\Delta V}}$$

$$k = \sqrt{\rho \cdot \varepsilon} \cdot A \text{ and}$$

$$C = \frac{k}{\sqrt{\Delta V}}$$

Therefore, to cause the output voltage of the transistor to transition linearly from the off state to the on state, a bias current is provided to the gate of the transistor that is proportional to an inverse of a square root of a drain-to-gate voltage. The bias current is provided so that current versus voltage has the same variation as depletion capacitance versus voltage. Increasing the bias current during the turn-on period in this manner offsets the effect of the depletion capacitance.

Figure 2:
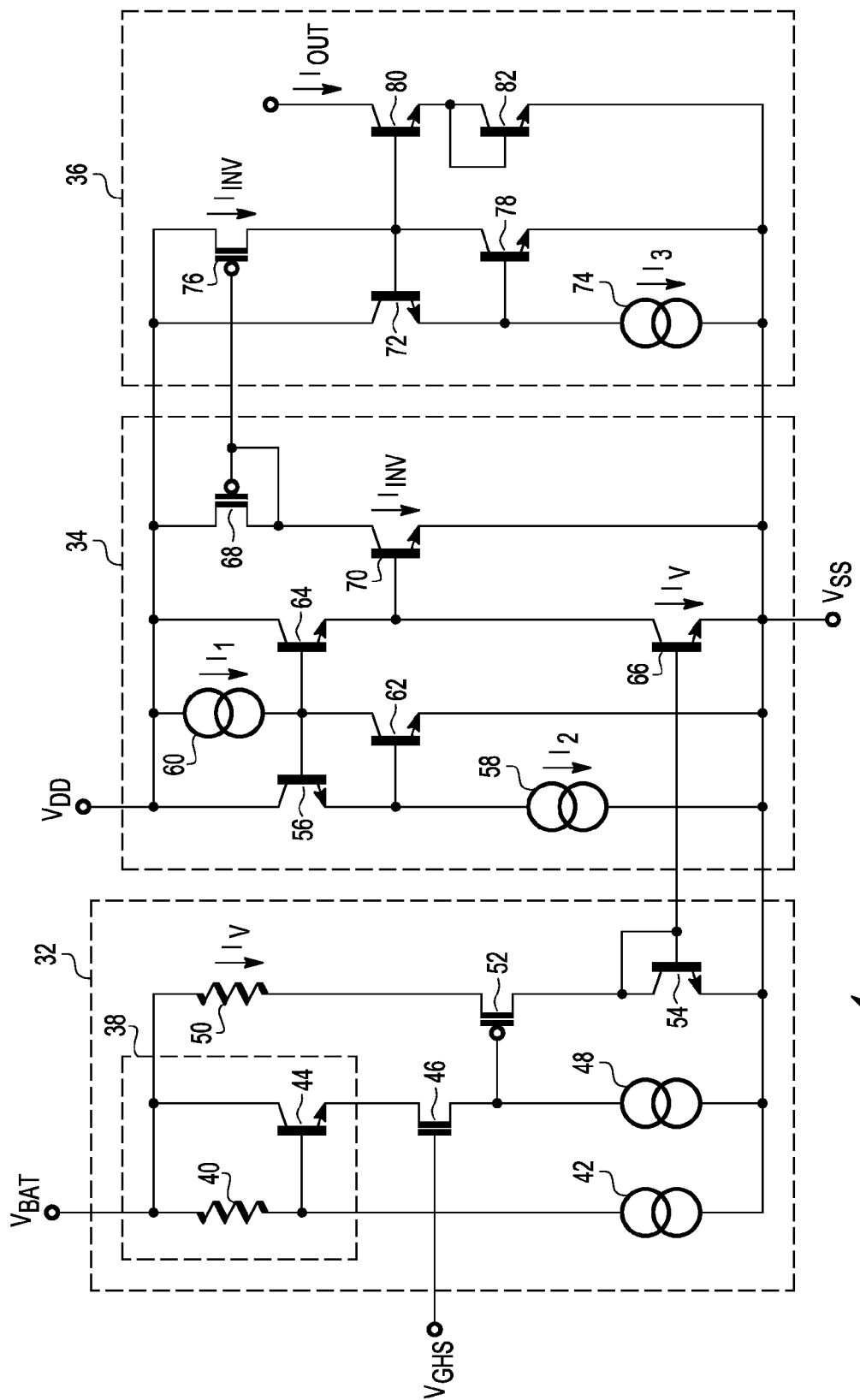
FIG. 2 illustrates, in schematic diagram form, one embodiment of the high side gate driver circuit of FIG. 1.

FIG. 2 illustrates, in schematic diagram form, one embodiment of the high side gate driver circuit 24 of FIG. 1. High side gate driver circuit 24 is a trans-linear circuit and includes analog subtraction circuit 32, analog inversion circuit 34, and analog square root circuit 36. Subtraction circuit 32 includes resistors 40 and 50, bipolar NPN transistors 44 and 54, N-channel transistor 46, P-channel transistor 52, and current sources 42 and 48. NPN transistor 44 and resistor 40 provide a clamp 38. Inversion circuit 34 includes NPN transistors 56, 62, 64, 66, and 70, current sources 58 and 60, and P-channel transistor 68. Square root circuit 36 includes NPN transistors 72, 78, 80, and 82, current source 74, and P-channel transistor 76.

High side gate driver circuit 24 causes the high side transistor 20 to be biased with a current that is proportional to an inverse of a square root of a drain-to-gate voltage ($V_{DG}$). This is done by using subtraction circuit 32, inversion circuit 34, and square root circuit 36 illustrated in FIG. 2.

In subtraction circuit 32, resistor 40 has a first terminal connected to power supply voltage terminal $V_{BAT}$, and a second terminal. Current source 42 has a first terminal connected to the second terminal of resistor 40, and a second terminal connected to power supply voltage terminal $V_{SS}$. NPN transistor 44 has a collector connected to $V_{BAT}$, a base connected to the second terminal of resistor 40, and an emitter. N-channel transistor 46 has a drain connected to the emitter of NPN transistor 44, a gate for receiving high side gate voltage $V_{GHS}$, and a source. Current source 48 has a first terminal connected to the source of transistor 46, and a second terminal connected to $V_{SS}$. Resistor 50 has a first terminal connected to $V_{BAT}$, and a second terminal. P-channel transistor 52 has a source connected to the second terminal of resistor 50, a gate connected to the source of N-channel transistor 46, and a drain. NPN transistor 54 has a collector and a base connected to the drain of transistor 52, and an emitter connected to $V_{SS}$. A current through resistor 50 is labeled "$I_V$". Current $I_V$ is equal to ($V_{BAT}$-$V_{GHS}$)/R, where R is the resistance of resistor 50. Because $V_{GHS}$ is bootstrapped, voltage $V_{GHS}$ can become greater than $V_{BAT}$ causing a negative voltage to be applied to the gate of transistor 20. Clamp circuit 38 prevents the analog inversion circuit 34 from receiving a negative voltage.

In inversion circuit 34, NPN transistor 56 has a collector connected to $V_{DD}$, a base, and an emitter. Current source 58 has a first terminal connected to the emitter of transistor 56, and a second terminal connected to $V_{SS}$. Current source 60 has a first terminal connected to $V_{DD}$, and a second terminal connected to the base of transistor 56. NPN transistor 62 has a collector connected to the second terminal of current source 60, a base connected to the emitter of transistor 56, and an emitter connected to $V_{SS}$. NPN transistor 64 has a collector connected to $V_{DD}$, a base connected to the second terminal of current source 60, and an emitter. NPN transistor 66 has a collector connected to the emitter of transistor 64, a base connected to the collector and base of transistor 54, and an emitter connected to $V_{SS}$. P-channel transistor 68 has a drain connected to $V_{DD}$, and a gate and a source. NPN transistor 70 has a collector connected to the gate and source of transistor 70, a gate connected to the emitter of transistor 64, and an emitter connected to $V_{SS}$. A current through current source 60 is labeled "$I_1$", a current through current source 58 is labeled "$I_2$", and a current through transistor 70 is labeled "$I_{INV}$". Current $I_V$ is mirrored from transistor 54 producing a current $I_V$ through transistor 66. Then, inverted current $I_{INV}$ is equal to current $I_1 \cdot I_2 / I_V$.

In square root circuit 36, P-channel transistor 76 has a source connected to $V_{DD}$, a gate connected to the gate and drain of transistor 68, and a drain. Transistors 68 and 76 form a current mirror, so that current $I_{INV}$ flows through transistor 76. Transistor 72 has a collector connected to $V_{DD}$, a base connected to the drain of transistor 76, and an emitter. Current source 74 has a first terminal connected to the emitter of transistor 72, and a second terminal connected to $V_{SS}$. NPN transistor 78 has a collector connected to the drain of transistor 76, a base connected to the emitter of transistor 72, and an emitter connected to $V_{SS}$. NPN transistor 80 has a collector for providing a current labeled "$I_{OUT}$", a base connected to the drain of transistor 76, and a emitter. NPN transistor 82 has a base and collector connected to the emitter of transistor 80, and an emitter connected to $V_{SS}$. Current $I_{OUT}$ is equal to the square root of $I_1 \cdot I_2 \cdot I_3 / I_V$. Current $I_{OUT}$ is provided to control current source 30 of FIG. 1.

Figure 3:
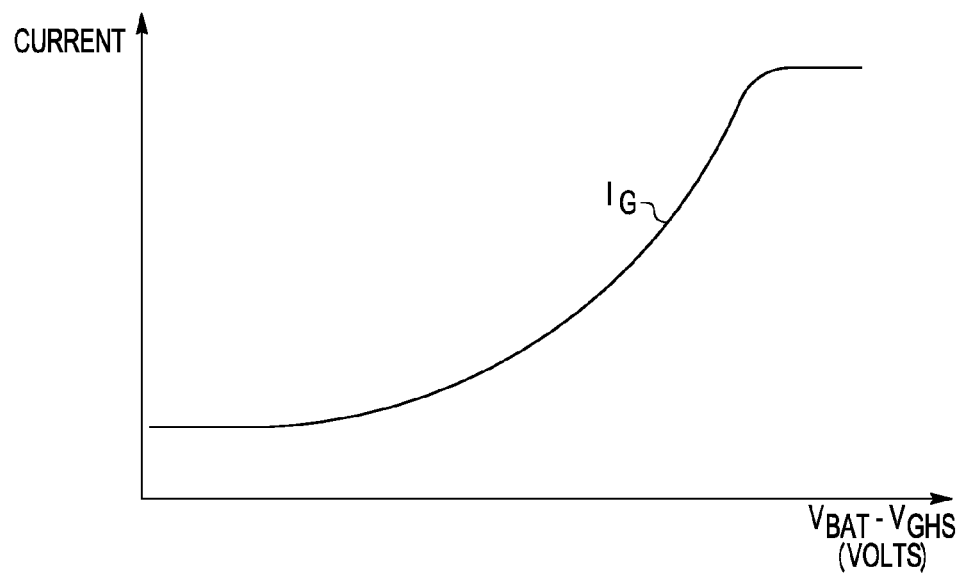
FIG. 3 illustrates a graph of gate current $I_G$ versus gate voltage $V_{BAT}-V_{GHS}$ of the circuit of FIG. 1.

FIG. 3 illustrates a graph of gate current $I_G$ versus gate voltage $V_{BAT}$-$V_{GHS}$ of the circuit of FIG. 1. The gate current of power MOS transistor 20 is a function of drain voltage minus gate voltage. In the illustrated embodiment, this is $V_{SAT}$-$V_{GHS}$. As can be seen in FIG. 3, the gate current $I_G$ increases as the gate voltage $V_{BAT}$-$V_{GHS}$ increases.

Figure 4:
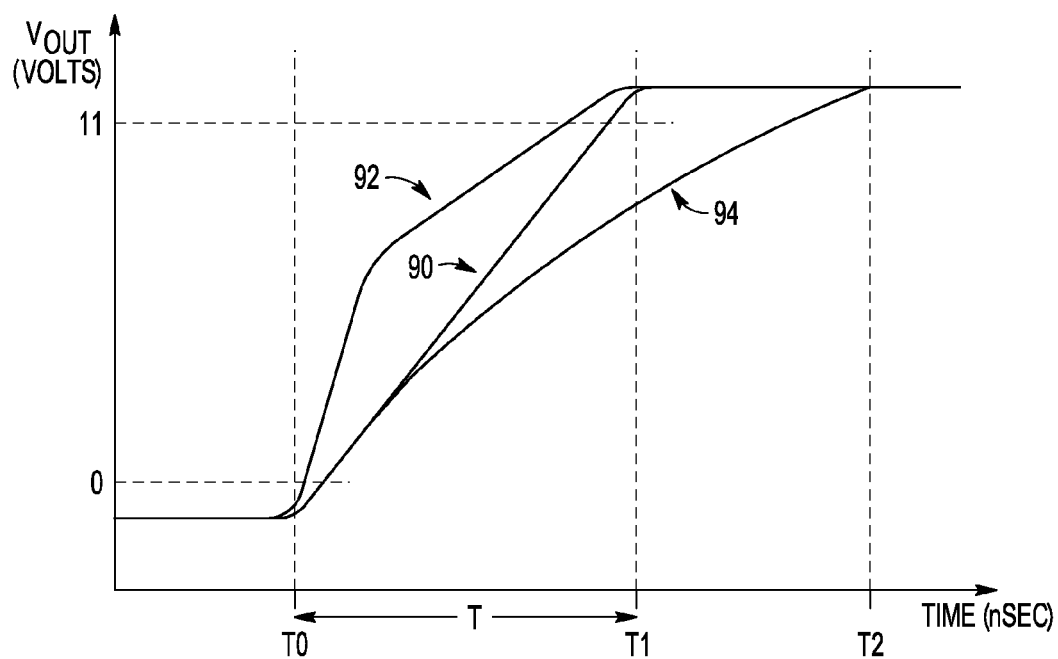
FIG. 4 illustrates a graph comparing the linear output voltage of the circuit of FIG. 1 with non-linear output voltages.

FIG. 4 illustrates a graph comparing the linear output voltage of the circuit of FIG. 1 with non-linear output voltages. FIG. 4 provides three example curves 90, 92, and 94 of a high side transistor output voltage. A time period T is bounded by time T0 and T1 and is a desired transition time from a low voltage to a high voltage. The example output voltage curve 94 is produced when the high side transistor is driven with a constant current. As can be seen, output voltage curve 94 begins the turn-on transition at T0 having a relatively high ramp up rate, but the ramp up rate becomes less because of the increasing depletion capacitance. The lower ramp up rate extends the turn on time to much greater than time T. Also, because of the extended turn on time, power dissipation will be greater. To shorten the turn on time period, a higher drive current may be provided. Output voltage curve 92 is an example of an output voltage during turn on with a higher constant drive current than was used to produce output voltage curve 94. As illustrated, the turn on time is within the time period T. However, the high ramp up rate can produce undesirable EMI. Output voltage curve 90 is an example output voltage curve produced using a drive current produced by high side gate drive circuit 24. The example curve 90 illustrates a relatively linear ramp up rate during the turn on transition. The transition is completed within time period T without undesirable EMI, while also providing lower power consumption.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, even though the present embodiment describes driving a high side NMOS transistor, a low side NMOS transistor could be driven using the same basic circuit. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A switching circuit comprising:
 a first transistor having a first current electrode coupled to a first power supply voltage terminal to receive a first power supply voltage, a control electrode, and a second current electrode coupled to an output terminal; and
 a driver circuit having an output coupled to the control electrode of the first transistor, the driver circuit for providing a bias current to the control electrode of the first transistor that is proportional to an inverse of a square root of a voltage between the first current electrode and the control electrode of the first transistor, wherein a voltage at the output terminal increases substantially linearly during a turn-on period of the first transistor.

2. The switching circuit of claim 1, wherein the driver circuit comprises:
 a subtraction circuit having a first input terminal coupled to the first power supply voltage terminal, a second input terminal coupled to the control electrode of the first transistor, and an output terminal;
 an inversion circuit having an input terminal coupled to the output terminal of the subtraction circuit, and an output terminal;
 a square root circuit having an input terminal coupled to the output of the inversion circuit, and an output terminal for providing an output current; and
 a current source having a first terminal coupled to a voltage terminal, a control terminal coupled to and a second terminal coupled to provide the bias current to the control electrode of the first transistor.

3. The switching circuit of claim 2, wherein the subtraction circuit further comprises a clamping circuit for preventing the control electrode of the first transistor from receiving a negative bias voltage.

4. The switching circuit of claim 2, wherein the voltage terminal is coupled to receive a boosted voltage.

5. The switching circuit of claim 1, wherein the first transistor is characterized as being a high side transistor.

6. The switching circuit of claim 1, further comprising a second transistor having a first current electrode coupled to the second current electrode of the first transistor, a control electrode, and a second current electrode coupled to a second power supply voltage terminal.

7. The switching circuit of claim 1, wherein the first transistor is characterized as being an N-channel power metal-oxide semiconductor transistor.

8. The switching circuit of claim 1, wherein the driver circuit comprises bipolar transistors.

9. The switching circuit of claim 1, further comprising a second driver circuit for biasing a second transistor, the second transistor coupled to the first transistor in a half-bridge configuration.

10. The switching circuit of claim 1, wherein the driver circuit comprises a trans-linear circuit.

11. A switching circuit comprising:
a transistor having a first current electrode coupled to a first power supply voltage terminal to receive a first power supply voltage, a control electrode, and a second current electrode coupled to an output terminal; and
a driver circuit comprising:
a subtraction circuit having a first input terminal coupled to the first power supply voltage terminal, a second input terminal coupled to the control electrode of the transistor, and an output terminal;
an inversion circuit having an input terminal coupled to the output terminal of the subtraction circuit, and an output terminal;
a square root circuit having an input terminal coupled to the output of the inversion circuit, and an output terminal for providing an output current; and
a current source having a first terminal coupled to a voltage terminal, a control terminal coupled to and a second terminal coupled to provide the bias current to the control electrode of the transistor.

12. The switching circuit of claim 11, wherein the subtraction circuit further comprises a clamping circuit for preventing the control electrode of the transistor from receiving a negative bias voltage.

13. The switching circuit of claim 11, wherein the voltage terminal is coupled to receive a boosted voltage.

14. The switching circuit of claim 11, wherein the transistor is characterized as being a high side transistor.

15. A switching circuit comprising:
a first transistor having a first current electrode coupled to a first power supply voltage terminal to receive a first power supply voltage, a control electrode, and a second current electrode coupled to an output terminal of the switching circuit;
a second transistor having a first current electrode coupled to the second current electrode of the first transistor, a control electrode, and a second current electrode coupled to a second power supply voltage terminal;
a first driver circuit having an output coupled to the control electrode of the first transistor, the driver circuit for providing a bias current to the control electrode of the first transistor that is proportional to an inverse of a square root of a voltage between the first current electrode and
the second current electrode of the first transistor, wherein a voltage at the output terminal increases substantially linearly during a turn-on period of the first transistor; and
a second driver circuit having an output coupled to the control electrode of the second transistor, the second driver circuit for controlling operation of the second transistor.

16. The switching circuit of claim 15, wherein the driver circuit comprises:
a subtraction circuit having a first input terminal coupled to the first power supply voltage terminal, a second input terminal coupled to the control electrode of the first transistor, and an output terminal;
an inversion circuit having an input terminal coupled to the output terminal of the subtraction circuit, and an output terminal;
a square root circuit having an input terminal coupled to the output of the inversion circuit, and an output terminal for providing an output current; and
a current source having a first terminal coupled to a voltage terminal, a control terminal coupled to and a second terminal coupled to provide the bias current to the control electrode of the first transistor.

17. The switching circuit of claim 16, wherein the subtraction circuit further comprises a clamping circuit for preventing the control electrode of the first transistor from receiving a negative bias voltage.

18. The switching circuit of claim 16, wherein the voltage terminal is coupled to receive a boosted voltage.

19. The switching circuit of claim 15, wherein the first and second transistors are characterized as being N-channel power metal-oxide semiconductor transistors.

20. The switching circuit of claim 15, further comprising a control unit coupled to control the operation of both the first and second driver circuits.

* * * * *